United States Patent
Kawamoto et al.

(10) Patent No.: US 10,286,702 B2
(45) Date of Patent: May 14, 2019

(54) ELECTRONIC CIRCUIT BOARD, AND PRODUCTION METHOD THEREFOR

(71) Applicant: KOMURA-TECH CO., LTD., Higashi-Osaka-shi, Osaka (JP)

(72) Inventors: Tadashi Kawamoto, Higashi-Osaka (JP); Shigeru Baba, Higashi-Osaka (JP); Youichi Sumoto, Higashi-Osaka (JP); Sakae Murata, Nomi (JP); Kazuhiko Tanaka, Nomi (JP)

(73) Assignee: KOMURA-TECH CO., LTD., Higashi-Osaka-shi (JP)

( * ) Notice: Subject to any disclaimer, the term of this patent is extended or adjusted under 35 U.S.C. 154(b) by 0 days.

(21) Appl. No.: 15/542,714

(22) PCT Filed: Jan. 25, 2016

(86) PCT No.: PCT/JP2016/051961
§ 371 (c)(1),
(2) Date: Jul. 11, 2017

(87) PCT Pub. No.: WO2016/121669
PCT Pub. Date: Aug. 4, 2016

(65) Prior Publication Data
US 2018/0001683 A1    Jan. 4, 2018

(30) Foreign Application Priority Data

Jan. 27, 2015    (JP) .................................. 2015-013218

(51) Int. Cl.
*H05K 1/09* (2006.01)
*H05K 3/12* (2006.01)
(Continued)

(52) U.S. Cl.
CPC ............... *B41M 1/30* (2013.01); *C09D 11/52* (2013.01); *H05K 1/0266* (2013.01); *H05K 1/09* (2013.01);
(Continued)

(58) Field of Classification Search
CPC ........ H05K 1/092; H05K 1/095; H05K 1/097; H05K 3/12; H05K 3/1208
See application file for complete search history.

(56) References Cited

U.S. PATENT DOCUMENTS 8,899,148 B2 * 12/2014 Rudolph ........... G02F 1/133711
101/216
9,980,394 B2 * 5/2018 Stay ......................... G06F 3/041
(Continued)

FOREIGN PATENT DOCUMENTS

JP    11-188967 A    7/1999
JP    2009-49275 A    3/2009
(Continued)

OTHER PUBLICATIONS

Notification of Transmittal of Translation of the International Preliminary Report on Patentability (Form PCT/IB/338) issued in counterpart International Application No. PCT/JP2016/051961 dated Aug. 10, 2017, with Forms PCT/IB/373 and PCT/ISA/237. (8 pages).
(Continued)

*Primary Examiner* — Nathan Milakovich
(74) *Attorney, Agent, or Firm* — Westerman, Hattori, Daniels & Adrian, LLP (57) ABSTRACT

An electronic circuit board includes an ink receiving layer formed from a resin composition containing a polyvinyl acetal resin as a main component, and an electronic circuit formed in a pattern from an electrically conductive ink. An electronic circuit board production method includes the
(Continued)

steps of: applying a liquid resin composition containing a polyvinyl acetal resin as a main component to form a layer of the liquid resin composition; heat-drying the liquid resin composition to form an ink receiving layer; and forming an electronic circuit in a predetermined circuit pattern from an electrically conductive ink by a printing method or a transferring method.

6 Claims, 5 Drawing Sheets

(51) Int. Cl.

| | | |
|---|---|---|
| B41M 1/30 | (2006.01) | |
| H05K 3/20 | (2006.01) | |
| H05K 1/02 | (2006.01) | |
| H05K 3/00 | (2006.01) | |
| C09D 11/52 | (2014.01) | |
| H05K 3/38 | (2006.01) | |

(52) U.S. Cl.
CPC .......... *H05K 1/097* (2013.01); *H05K 3/0052* (2013.01); *H05K 3/12* (2013.01); *H05K 3/20* (2013.01); *H05K 3/386* (2013.01); *H05K 3/0008* (2013.01); *H05K 3/1275* (2013.01); *H05K 2201/0909* (2013.01); *H05K 2201/09127* (2013.01)

(56) References Cited

U.S. PATENT DOCUMENTS

| | | | | |
|---|---|---|---|---|
| 2009/0139891 A1* | 6/2009 | Oshima | ................ | B32B 38/145 206/497 |
| 2011/0081527 A1* | 4/2011 | Yamato | ................ | H05K 3/386 428/195.1 |
| 2012/0043512 A1* | 2/2012 | Liu | ................ | B41M 3/006 252/519.21 |
| 2012/0097059 A1* | 4/2012 | Allemand | ................ | C09D 11/52 101/483 |
| 2012/0177897 A1* | 7/2012 | Jablonski | ................ | B22F 1/0022 428/208 |
| 2012/0280186 A1* | 11/2012 | Sano | ................ | B22F 1/0022 252/514 |
| 2013/0001479 A1 | 1/2013 | Kanehara et al. | | |
| 2015/0259557 A1* | 9/2015 | Sekiguchi | ................ | H05K 1/092 174/257 |
| 2017/0295651 A1* | 10/2017 | Kanehara | ................ | B41M 1/04 |

FOREIGN PATENT DOCUMENTS

| | | |
|---|---|---|
| JP | 2014-204612 A | 10/2014 |
| JP | 2016-76538 A | 5/2016 |
| WO | 2011/114713 A1 | 9/2011 |

OTHER PUBLICATIONS

International Search Report dated Apr. 5, 2016, issued in counterpart application No. PCT/JP2016/051961. (2 pages).

Extended (supplementary) European Search Report dated Aug. 23, 2018, issued in counterpart European Application No. 16743272.3. (7 pages).

Office Action dated Sep. 25, 2018, issued in counterpart Japanese Application No. 2015-013218, with English machine translation. (5 pages).

* cited by examiner

ELECTRONIC CIRCUIT BOARD, AND PRODUCTION METHOD THEREFOR

TECHNICAL FIELD

The present disclosure relates to a highly reliable electronic circuit board including an ink receiving layer and an electronic circuit formed in a pattern from an electrically conductive ink, and to a production method therefore.

BACKGROUND ART

In printed electronics, electronic circuits, devices and the like are formed by utilizing a printing technology. For example, a functional material (electrically conductive material) of an ink form is applied in a certain pattern onto a surface of a substrate (base) by a printing method, a transferring method or the like. In recent years, the printed electronics are an attractive technology which makes it possible to produce large-area electronic circuits and devices at lower costs without a need for an expensive large-scale production equipment such as a vacuum equipment. However, the conventional printed electronics technology requires a firing process to fire the functional material (electrically conductive material) at a temperature of 100° C. to 200° C. or higher and, therefore, is disadvantageous in that a lower-melting point base, particularly a material such as a resin film susceptible to thermal expansion and contraction, cannot be used as the base.

To cope with this, the inventors developed an electrically conductive ink (nano-ink composition, see PTL 1) which obviates the need for the firing after application thereof, and proposed an electronic circuit board production method which is capable of efficiently and stably forming an electronic circuit pattern having a sufficient electrical conduction property on a thermally-unstable flexible base such as paper or a resin film with the use of the nano-ink (Japanese Patent Application No. 2014-204612).

This electronic circuit board production method obviates the need for the firing process and, therefore, the entire production process can be performed at a temperature at which the materials such as paper and resin film are unlikely to suffer from deformation and thermal expansion and contraction which may otherwise cause permanent setting of the material shape. Further, the nano-ink composition is applied onto the base in an ordinary temperature atmosphere by a flexographic printing method or the like, and then dried to be fixed to the base at a temperature of not higher than 40° C. Therefore, an electronic circuit of a minute pattern can be highly accurately formed on the thermally-unstable flexible base.

RELATED ART DOCUMENT

Patent Document

PTL 1: WO2011/114713

SUMMARY OF INVENTION

In the conventional printed electronics technology employing the nano-ink composition or an ordinary electrically conductive ink, the nano-ink composition or the like is printed on a photographic printing inkjet paper sheet (e.g., a thicker photographic glossy paper sheet) by means of an inkjet printer in the production of the electronic circuit board or in prototype production before mass production.

When the inventors actually printed the nano-ink composition or the like on a variety of commercially available inkjet paper sheets to form patterns of electronic circuits, however, the inventors found that the electronic circuits had variations in electrical conduction property depending on the type of the paper sheet, and some of the electronic circuits failed to maintain their electrical conduction properties required for the electronic circuits (wirings) over time. Therefore, it is imperative to develop a print (transfer) base which permits an electronic circuit to stably maintain a certain quality with a proper electrical conduction property and the like for a longer period of time when the electronic circuit board is produced at an ordinary temperature at an atmospheric pressure by the printing method with the use of the electrically conductive ink such as the nano-ink composition.

In view of the foregoing, it is an object to provide a highly reliable electronic circuit board which ensures proper electrical conduction of an electronic circuit thereof even if being produced at an ordinary temperature at an atmospheric pressure, and to provide an electronic circuit board production method which permits stable and efficient production of the electronic circuit board.

According to a first inventive aspect to achieve the object described above, there is provided an electronic circuit board which includes: an ink receiving layer formed from a resin composition containing a polyvinyl acetal resin as a main component; and an electronic circuit formed in a pattern from an electrically conductive ink.

According to a second inventive aspect, there is provided an electronic circuit board production method which includes the steps of: applying a liquid resin composition containing a polyvinyl acetal resin as a main component to form a layer of the liquid resin composition; heat-drying the liquid resin composition to form an ink receiving layer; and forming an electronic circuit in a predetermined circuit pattern from an electrically conductive ink by a printing method or a transferring method.

The inventors conducted studies on the variations in the electrical conduction property of the electronic circuit which are caused when a commercially available inkjet paper sheet (photographic glossy paper sheet or the like) is used as a base (circuit support base) or a carrier (transport support base to be removed later) for forming an electronic circuit (electrically conductive ink layer) from an electrically conductive ink by the printing method or the transferring method. The commercially available inkjet paper sheet generally includes a receiving layer (ink receiving layer) which absorbs and receives a pigment ink or a dye ink printed thereon to assist the color development and the fixation of the ink, and the receiving layer is formed by coating or surface-treating a surface (printing surface) of the inkjet paper sheet. In the studies, the inventors supposed that the receiving layer is responsible for the variations in electrical conduction property, and further conducted studies on the components of the receiving layer of the inkjet paper sheet or the like. As a result, the inventors found that the receiving layer of the commercially available inkjet paper sheet contains a cationic substance (a quaternary ammonium salt, cationic colloidal silica, a hindered amine compound or other cationic component) for enhancement of the color developability of the pigment/dye ink and improvement of the water resistance and the weather resistance of the ink, and the cationic substance is liable to reduce the electrical conduction of the electronic circuit (electrically conductive ink layer) printed on the ink receiving layer and cause dielectric breakdown of the base due to moisture absorption and emanation of chlorine over time.

Based on the aforementioned findings, the inventors further conducted studies on a coating resin which is free from the aforementioned cationic substance (cationic component) and has moderate water absorbability (ink solvent absorbability), proper physical properties for the printing base (carrier), and higher affinity for a resin film (e.g., a polyethylene terephthalate (PET) film) to be often used as the base, among other various resins to be used for forming the receiving layer by coating. As a result, the inventors found, based on repeated experiments and prototype production, that the polyvinyl acetal resin is an optimum resin to be used for the receiving layer among many candidates, and attained the present disclosure.

The expression "a resin composition containing a polyvinyl acetal resin as a main component" herein means that "polyvinyl acetal resin" which is a generic term for polyvinyl acetoacetal (PVAA) resins, polyvinyl formal (PVF) resins and polyvinyl butyral (PVB) resins prepared by reactions between polyvinyl alcohols (PVA) and aldehydes is contained as the main component in the resin composition. In the present disclosure, a layer or a film of the resin composition is formed on the surface of the base or the carrier. The term "main component" herein means a component that accounts for the majority (not less than 50 weight %) of the overall resin component contained in the resin composition, and also means that the resin component of the resin composition may include the main component alone.

The inventive electronic circuit board includes the ink receiving layer formed from the resin composition which contains the polyvinyl acetal resin as the main component and is free from the aforementioned cationic component, and the electronic circuit formed in the pattern from the electrically conductive ink. With this arrangement, the inventive electronic circuit board is substantially free from electrical discontinuity of an electronic circuit portion (i.e., wiring disconnection and other defects), and is capable of maintaining its performance for a longer period of time.

Where the electrically conductive ink is a nano-ink composition containing metal particles in the inventive electronic circuit board, the electronic circuit can be fixed onto the base as having the predetermined pattern without the need for application of higher temperature heat to the base for the drying of the electrically conductive ink. Therefore, even if a highly thermally expansible/contractible flexible base such as a resin film is used for the inventive electronic circuit board, the electronic circuit board has a higher quality without variations in electrical conduction property and other performance.

In the inventive electronic circuit board, a composition containing metal nano-particles, an organic π-conjugated ligand and a solvent is preferably used as the nano-ink composition. Further, a partially benzalated polyvinyl alcohol (a type of the polyvinyl acetoacetal resin) is preferably used as the polyvinyl acetal resin.

On the other hand, the inventive electronic circuit board production method includes the steps of: applying the liquid resin composition containing the polyvinyl acetal resin as the main component and free from the cationic component to form the layer of the liquid resin composition; heat-drying the liquid resin composition to form the ink receiving layer; and forming the electronic circuit in the predetermined circuit pattern from the electrically conductive ink by the printing method or the transferring method. With this arrangement, the electronic circuit board can be efficiently produced by the inventive production method, and the electronic circuit board thus produced has a stable quality and maintains its performance with a proper electrical conduction property of the electronic circuit thereof for a longer period of time.

In the inventive electronic circuit production method, the electrically conductive ink may be a nano-ink composition containing metal particles, and the electronic circuit forming step may include the steps of applying the nano-ink composition in the predetermined circuit pattern, and drying and fixing the nano-ink composition. In this case, even if a thermally-unstable flexible base is used as the base for the electronic circuit board, the electronic circuit can be stably and accurately formed in the predetermined pattern on the surface of the ink receiving layer as having a higher quality without variations in electrical conduction property and other performance in a temperature environment in which the base is free from an irreversible temperature strain and excessive thermal expansion and contraction. In addition, the inventive electronic circuit board production method is advantageous in that the electronic circuit board can be produced at lower running costs with a smaller initial investment without the need for a large-scale equipment such as a vacuum equipment and an oven for heating and firing in the drying step.

In the inventive electronic circuit board production method, a composition containing metal nano-particles, an organic π-conjugated ligand and a solvent is preferably used as the nano-ink composition. Further, a partially benzalated polyvinyl alcohol (a type of the polyvinyl acetoacetal resin) is preferably used as the polyvinyl acetal resin.

The inventive electronic circuit board production method may be employed not only where the electrically conductive ink is printed or transferred in the predetermined pattern on the base once but also where the electrically conductive ink is (repeatedly) applied onto the same region of the base a plurality of times. In the latter case, the drying (fixing) step may be performed every after the printing/transferring step is performed, or may be performed once to dry (fix) the repeatedly applied electrically conductive ink after the printing/transferring step is performed a plurality of times, depending on the state of the surface of the base observed after the printing/transferring step.

DESCRIPTION OF EMBODIMENTS

Next, embodiments of the present disclosure will be described based on the drawings. In each of the drawings, a base, an ink receiving layer, an electronic circuit (wirings made of an electrically conductive ink layer) are illustrated as each having a greater thickness for emphasis.

Figure 1:
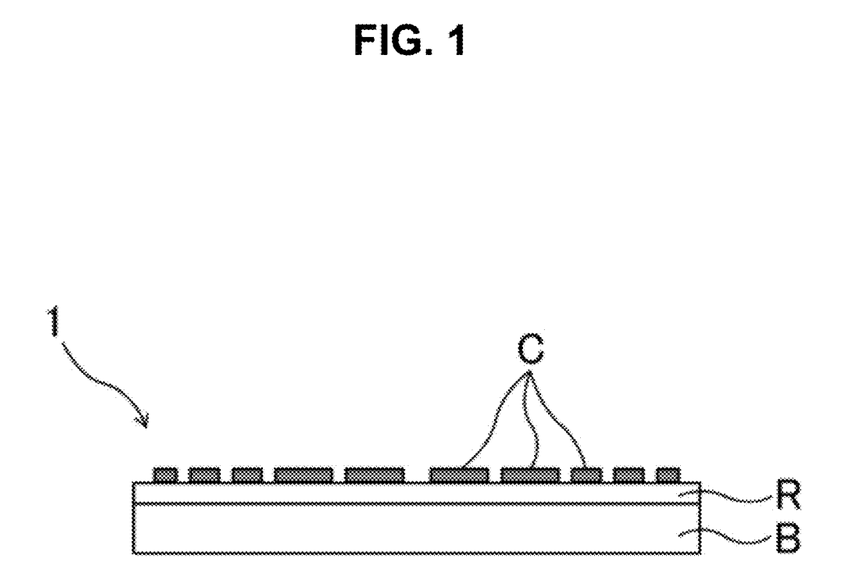
FIG. 1 is a diagram for describing the structure of an electronic circuit board according to a first embodiment of the present disclosure.
Figure 2:
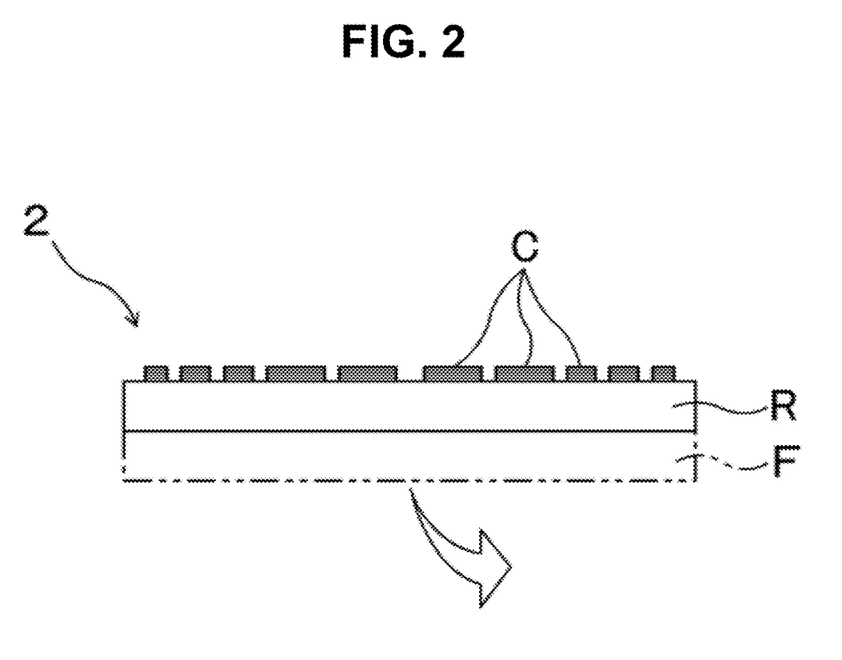
FIG. 2 is a diagram for describing the structure of an electronic circuit board according to a second embodiment of the present disclosure.

FIG. 1 is a structural diagram illustrating an electronic circuit board 1 of a first embodiment of the present disclosure, and FIG. 2 is a structural diagram illustrating an electronic circuit board 2 of a second embodiment obtained by removing a transport base (carrier) from the aforementioned electronic circuit board 1 after formation of an electronic circuit. The electronic circuit boards 1, 2 according to the first and second embodiments each mainly include an ink receiving layer R formed from a resin composition containing a polyvinyl acetal resin as a main component, and an electronic circuit C provided on the ink receiving layer R. In the first embodiment (FIG. 1), a base B of paper (paper sheet) or a resin film is provided on a lower side (on a back surface) of the electronic circuit board 1 as a support for supporting the electronic circuit C and the ink receiving layer R.

The components employed in the embodiments of the present disclosure will be described in detail. First, the ink receiving layer R is a layer (or a coating film) formed as having a predetermined thickness by applying a liquid resin composition prepared by dispersing a polyvinyl acetal resin in an aqueous solvent (solvent mixture) on a surface of abase B, a carrier For the like, and drying the applied resin composition. Any application methods such as a bar coating method and a spin coating method may be used for the application of the liquid resin composition, as long as the liquid resin composition can be applied to a uniform thickness. Where the liquid resin composition is applied in a certain pattern, a printing method such as an inkjet printing method or a flexographic printing method may be used.

The polyvinyl acetal resin to be contained as the main component of the ink receiving layer R (accounting for the majority of a resin component of the resin composition) is prepared by allowing a polyvinyl alcohol (PVA) to react with an aldehyde such as formaldehyde, butyraldehyde or benzaldehyde. Examples of the polyvinyl acetal resin include a polyvinyl acetoacetal (PVAA) resin, a polyvinyl formal (PVF) resin and a polyvinyl butyral (PVB) resin which each have a hydroxyl group, an acetyl group, a formal group, a butyral group and/or a benzal group at its terminal. Specific examples of the polyvinyl acetal resin include S-LEC (registered trade name) BL-1, BL-2, BL-5, BL-10, BM-1, BH-1, BX-1, KS-1, KS-3, KX-1, KX-5, KW-1, KW-3 and KW-10 (available from Sekisui Chemical Co., Ltd.) and MOWITAL (registered trade name) B14S, B16H, B20H, B30T and B30H (available from Kuraray Co., Ltd.) Particularly, a partially benzalated polyvinyl alcohol (polyvinyl acetoacetal) is preferred. S-LEC (registered trade name) KX-1, KX-5 or the like is preferably used.

A polyester (PE) resin, a polyvinyl alcohol (PVA) resin or an acryl resin which is, like the polyvinyl acetal resin, free from the cationic substance (cationic component) maybe added as a subcomponent resin other than the polyvinyl acetal resin for the ink receiving layer R (resin composition). The proportion of the subcomponent resin other than the polyvinyl acetal resin is less than 50 weight % based on the weight of the overall resin component.

The resin composition containing the polyvinyl acetal resin as the main component for the ink receiving layer R is prepared in the form of a liquid resin composition (varnish) which contains water, a water-based solvent mixture, an alcohol, an alcohol-based solvent mixture or the like as a resin dispersion medium before the application. Exemplary solvents other than water include alcohols, ethers, esters, ketones and amides. Particularly, water/alcohol solvent mixtures are preferred, which are less expensive and easy to handle. Of these solvents, a particularly preferred solvent is a water/isopropanol solvent mixture (water/isopropyl alcohol=70/30 to 30/70).

In the liquid resin composition containing the polyvinyl acetal resin as the main component before the application, the resin component is typically present in a proportion (solid proportion) of 5 to 20 weight % based on the total weight of the resin component and the solvent. The liquid resin composition has a viscosity of 100 to 10000 mPa·s. After the application of the liquid resin composition, heat is applied to the liquid resin composition up to a temperature of about 80° C. to about 120° C. for about 1 to about 10 minutes to evaporate the solvent from the resin composition, whereby the ink receiving layer R is formed as a layer (solid-phase layer) containing only the resin component free from the cationic substance (cationic component).

Next, the electronic circuit C will be described. The electronic circuit C is a layer (or a coating film) formed as having a predetermined thickness by applying an electrically conductive ink containing metal particles and the like in a predetermined circuit pattern (as seen in plan) on a surface of the ink receiving layer R by a printing method, a transferring method or the like, and drying the electrically conductive ink. An inkjet printing method, a relief printing method such as a typographic printing method or a flexographic printing method, an intaglio printing method such as a gravure printing method, a lithographic printing method such as an offset printing method or a gravure offset printing method, a stencil printing method such as a screen printing method, a manual circuit pattern drawing method or the like may be used for the formation of the electronic circuit C.

Usable as the electrically conductive ink for the electronic circuit C are an ink mainly containing metal nano-particles, a binder and water (an aqueous electrically conductive ink of a lower-temperature firing type), an electrically conductive ink not requiring a firing process (a nano-ink composition containing metal nano-particles, see PTL 1), and the like.

The aqueous electrically conductive ink of the lower-temperature firing type preferably employs, for example, silver particles as the metal nano-particles. The metal nano-particles preferably each have a spherical shape, a flake shape or a scale shape, and preferably have an average particle diameter (or an average circle-equivalent diameter) of 0.2 to 100 nm before the heating (firing).

Examples of the binder for the aqueous electrically conductive ink include binders of hydrophilic resins such as acryl resins, vinyl acetate resins and polyvinyl alcohol resins, and binders of organic complex compounds including silver particles coordinated with amine molecules (as a protective colloid). The aqueous electrically conductive ink is prepared as having a viscosity of 0.5 to 1000 mPa·s by homogeneously dispersing the binder and the silver particles in a water medium (dispersion medium). Where the inkjet printing method is employed, the viscosity of the ink is controlled at a lower level even with the same solid proportion of the ink. As required, additives such as a plasticizer, a lubricant, a dispersant, a leveling agent, a defoaming agent and an antioxidant are added to the aqueous electrically conductive ink.

The electrically conductive ink (nano-ink composition) not requiring the firing process is an ink composition containing metal nano-particles (metal particles having particle sizes on a nanometer order (not less than 1 nm and less than 1000 nm)), an organic π-conjugated ligand and a solvent. With the organic π-conjugated ligand π-bonded to the metal nano-particles, the ink composition is imparted with electrical conductivity by strong π-bonds and inter-particle approach.

Exemplary metals for the metal nano-particles include gold, silver, copper, platinum, palladium, nickel, ruthenium, indium and rhodium, which may be used alone or may be used in combination as a mixture. In the nano-ink composition, the metal nano-particles are preferably present in a proportion of 0.1 to 20 weight %, more preferably 0.5 to 10 weight %.

Examples of the organic π-conjugated ligand for the nano-ink composition include an organic π-conjugated ligand having at least one substituent (substituent coordination-bonded to surfaces of the metal nano-particles) selected from an amino group, a mercapto group, a hydroxyl group, a carboxyl group, a phosphine group, a phosphonic acid group, a halogen group, a selenol group, a sulfide group and a selenoether group, and an organic π-conjugated ligand having at least one substituent (substituent which makes the metal nano-particles soluble in an aqueous solvent and an alcohol solvent) selected from an amino group, an alkylamino group, an amide group, an imide group, a phosphonic acid group, a sulfonic acid group, a cyano group and a nitro group, and salts of these groups.

Preferred examples of the solvent for the nano-ink composition include water, a water-based solvent mixture, an alcohol and an alcohol-based solvent mixture. Exemplary solvents other than water include alcohols, ethers, esters, ketones and amides, among which the alcohols are preferred and C1 to C10 alcohols are more preferred. Of these solvents, methanol, ethanol, 2-ethoxyethanol, ethylene glycol or propylene glycol is particularly preferably used. The nano-ink composition preferably has a viscosity of about 0.001 to about 5 Pa·s, more preferably 0.01 to 4 Pa·s.

In consideration of costs, handling ease and storage stability, a specific preferred example of the nano-ink composition is a nano-silver colloidal ink (available under the trade name of DryCure from Colloidal Ink Co., Ltd.)

The electrically conductive ink (the aqueous electrically conductive ink of the lower temperature firing type or the nano-ink composition not requiring the firing process) is applied in the predetermined circuit pattern on the ink receiving layer R by the inkjet printing method or the transferring method using a flexographic plate to form an electrically conductive ink layer (in a liquid phase), and then heat-dried, whereby the electronic circuit C is formed on the ink receiving layer R with proper electrical conduction ensured between electronic circuit portions (wirings) thereof.

Finally, the base B which supports the ink receiving layer R and the electronic circuit C provided on the ink receiving layer R will be described. In consideration of compatibility, adhesion and the like of the base B with respect to the resin composition for the ink receiving layer R, paper (paper sheet) or a resin film surface-treated by a plasma treatment, a corona treatment, soft X-ray irradiation or UV irradiation is preferably used. Exemplary materials for the film include soft resins such as polyethylene terephthalate (PET) resins, polyester (PE) resins, polypropylene (PP) resins, polyimide (PI) resins and polyamide (PA) resins. In consideration of costs and handling ease, a polyethylene terephthalate (PET) resin film is preferably used, and a PET resin film surface-treated by the corona treatment is particularly preferably used.

Besides the aforementioned resins, a rigid resin such as an epoxy resin or a phenol resin, glass or a metal may be used as the material for the base B, although the flexibility of the base is impaired. Further, leather, skin, artificial skin, a film of food fibers or cellulose nano-fibers, an animal-derived film such as produced by microorganisms or bacteria and a film derived from a plant such as a tree or a vegetable, which are particularly likely to be affected by heat or likely to be deteriorated in physical properties in a specific atmosphere, are also usable as the base for the inventive electronic circuit board, as long as they can maintain their film forms.

As in the second embodiment, the base B (illustrated as the carrier F in FIG. 2) may serve as a board transport carrier which is removed after temporarily supporting the electronic circuit C in the formation of the electronic circuit C. In this case, a material for the carrier F can be selected from a wider variety of materials including a silicone resin excellent in releasability without consideration of the compatibility and the adhesion of the carrier F with respect to the ink receiving layer R.

In a production method for the electronic circuit board 1 according to the first embodiment, as shown in FIG. 1, a base B of a polyethylene terephthalate (PET) resin is placed on a flat surface, and a liquid resin composition containing a polyvinyl acetal resin as a major component is applied to a predetermined thickness on the base B by a bar coater or the like, whereby a layer (film) of the liquid resin composition is formed on the base B. Then, the layer of the liquid resin composition is heated to evaporate a solvent contained in the liquid resin composition. Thus, the ink receiving layer R of the resin composition (in a solid phase) is formed. The ink receiving layer R (resin composition layer) thus formed typically has a thickness of 0.1 to 30 μm, preferably 1 to 10 μm.

Subsequently, the base B formed with the ink receiving layer R is set in a flexographic printing machine, and an ink tank of the printing machine is filled with a predetermined nano-ink composition (a nano-silver colloidal ink available under the trade name of DryCure from Colloidal Ink Co., Ltd.) in standby. In order to prevent the nano-silver colloidal ink from being inadvertently dried on the flexographic printing machine, the atmosphere around the flexographic printing machine is desirably conditioned at not lower than 60% RH by means of a humidifier, an air conditioner or the like before the start of the production.

In turn, a flexographic printing plate having an ink retaining portion of a predetermined circuit pattern is prepared, and set on a printing plate cylinder. Then, the flexographic printing machine is actuated to rotate the printing plate cylinder, thereby causing the printing plate to retain the nano-silver colloidal ink. At the same time, the printing plate retaining the ink is brought into kiss touch with the base B formed with the ink receiving layer R to transfer the nano-silver colloidal ink in the predetermined pattern onto the surface of the ink receiving layer R.

Thereafter, the base B with the nano-silver colloidal ink transferred on the surface of the ink receiving layer R is moved onto another flat place, and the electrically conductive ink layer of the nano-silver colloidal ink (in a liquid phase) is dried (fixed or formed into a coating film). Thus, the electronic circuit board 1 (including the base B and the electronic circuit C) according to the first embodiment is produced. The electronic circuit C (electrically conductive ink layer) thus formed typically has a thickness of 0.05 to 20 μm, preferably 0.5 to 10 μm.

The electrically conductive ink layer may be naturally dried, but the drying period may be reduced by using an air blower or a hot air dryer in a temperature range in which the base is free from irreversible thermal strain. Further, the electrically conductive ink layer may be dried by an indirect irradiation heating method utilizing heat radiation from an infrared lamp, a heater lamp, a solar light or the like, or high-frequency heating by ultrasonic waves or high-frequency currents in a temperature range in which the base is free from irreversible thermal strain.

If the thickness of the electrically conductive ink layer (electronic circuit C) is smaller than the predetermined thickness after the drying of the electrically conductive ink layer, the nano-silver colloidal ink is repeatedly transferred in the same position on the ink receiving layer R to form the electrically conductive ink layer (electronic circuit C) having the predetermined thickness. In this production method, the flexographic printing plate is used for the formation of the electrically conductive ink layer (electronic circuit C), but the conventional inkjet printing method may be employed for the formation of the electrically conductive ink layer (electronic circuit C).

The electronic circuit board 1 produced by the aforementioned production method includes the ink receiving layer R formed from the resin composition containing the polyvinyl acetal resin free from the cationic component as the main component, and the electrically conductive ink layer (electronic circuit C) formed in the predetermined pattern from the nano-silver colloidal ink on the ink receiving layer R. Therefore, the electronic circuit board 1 of the first embodiment has a higher quality, and ensures proper electrical conduction and other performance without disconnection of the electronic circuit C and other defects.

In the aforementioned production method for the electronic circuit board 1, the electrically conductive ink layer (electronic circuit C) of the nano-silver colloidal ink can be efficiently and accurately formed in the predetermined pattern on the surface of the ink receiving layer R in a temperature environment in which the base B is free from the irreversible temperature strain and excessive thermal expansion and contraction, even if a thermally-unstable flexible base such as of a resin is used as the base B.

Next, the electronic circuit board 2 of the second embodiment shown in FIG. 2 will be described. The electronic circuit board 2 including only the ink receiving layer R and the electronic circuit C is produced by producing an electronic circuit board including a base (a carrier F as a transport support) by the same production method as that of the first embodiment, and then removing the carrier F.

The ink receiving layer R of the electronic circuit board 2 has a greater thickness than that of the electronic circuit board 1 of the first embodiment, because the ink receiving layer R serves to maintain the shape of the electronic circuit board 2 after the removal of the carrier F. The ink receiving layer R typically has a thickness (layer thickness) of 1 to 1000 μm, preferably 10 to 200 μm.

As previously described, a base such as of a silicone resin is preferably used as the carrier F in consideration of the compatibility, the adhesion and the releasability of the carrier F with respect to the ink receiving layer R. The other arrangement of the electronic circuit board 2 is the same as the electronic circuit board 1 of the first embodiment.

Like the electronic circuit board 1, the electronic circuit board 2 includes the ink receiving layer R of the resin composition containing the polyvinyl acetal resin free from the cationic component as the main component, and the electrically conductive ink layer (electronic circuit C) formed in the predetermined pattern on the ink receiving layer R. With this arrangement, the electronic circuit board 2 provides the same effect as in the first embodiment. That is, the electronic circuit board 2 has a higher quality, and ensures proper electrical conduction and other performance without disconnection of the electronic circuit C and other defects.

Figure 3:
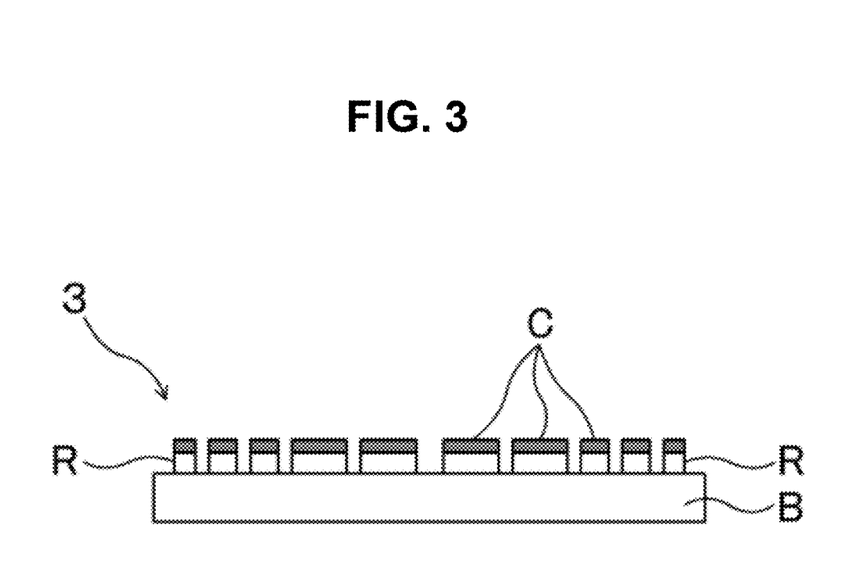
FIG. 3 is a diagram for describing the structure of an electronic circuit board according to a third embodiment of the present disclosure.

Next, an electronic circuit board 3 of a third embodiment shown in FIG. 3 will be described. The electronic circuit board 3 is produced by using the same base B as in the first embodiment, forming an ink receiving layer R from a resin composition containing a polyvinyl acetal resin as a main component in a predetermined pattern on the base B by the inkjet printing method, the flexographic printing method or the like, and forming an electrically conductive ink layer (electronic circuit C) on the ink receiving layer R in the same pattern as that of the ink receiving layer R by the inkjet printing method, the flexographic printing method or the like. The other arrangement of the electronic circuit board 3 is the same as in the first embodiment.

Figure 4:
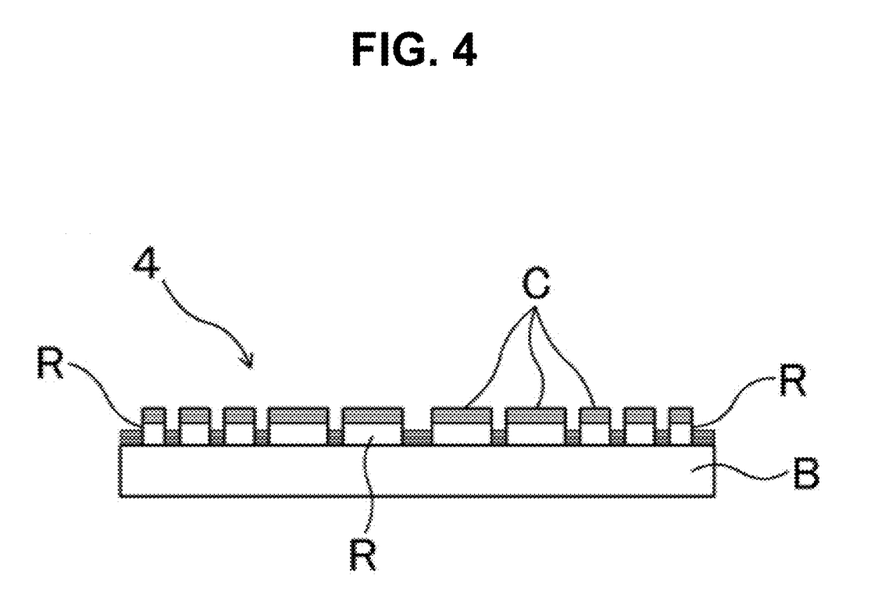
FIG. 4 is a diagram for describing the structure of an electronic circuit board according to a fourth embodiment of the present disclosure.

Further, an electronic circuit board 4 of a fourth embodiment shown in FIG. 4 will be described. The electronic circuit board 4 is produced by using the same base B as in the first and third embodiments, forming an ink receiving layer R from a resin composition containing a polyvinyl acetal resin as a main component in a predetermined pattern on the base B by the inkjet printing method, the flexographic printing method or the like, and solidly applying an electrically conductive ink over the ink receiving layer R of the predetermined pattern by a bar coating method, a spin coating method or the like to coat the ink receiving layer R and exposed portions of the base B with a layer of the electrically conductive ink. The other arrangement of the electronic circuit board 4 is the same as in the first and third embodiments. It is proved that portions of the electrically conductive ink present on the exposed portions of the base B (between adjacent portions of the ink receiving layer R) are not relevant to the electrical conduction of the electronic circuit C. In this embodiment, the electronic circuit C has the same pattern as the ink receiving layer R.

The third and fourth embodiments provide the same effect as the first embodiment. The electronic circuit boards 3, 4 of the third and fourth embodiments include no shape support member in place of the base B. Unlike in the second embodiment, it is impossible to use the base B as the carrier F (transport support) and to remove the base B from the electronic circuit board.

Next, an electronic circuit board 5 of a fifth embodiment shown in FIG. 5 will be described. The electronic circuit board 5 is produced with a base inverted by forming an ink receiving layer R and an electronic circuit C in a reverse order as compared with the electronic circuit board 2 of the second embodiment. That is, the electronic circuit board 5 is produced by using the same carrier F as in the second embodiment, forming an electrically conductive ink layer (electronic circuit C) in a predetermined pattern on the carrier F by the inkjet printing method, the flexographic printing method or the like, and applying a resin composition containing a polyvinyl acetal resin as a main component over the electrically conductive ink layer (electronic circuit C) and exposed portions of the carrier F by the bar coating method, the spin coating method or the like to form an ink receiving layer R from the resin composition.

Figure 5:
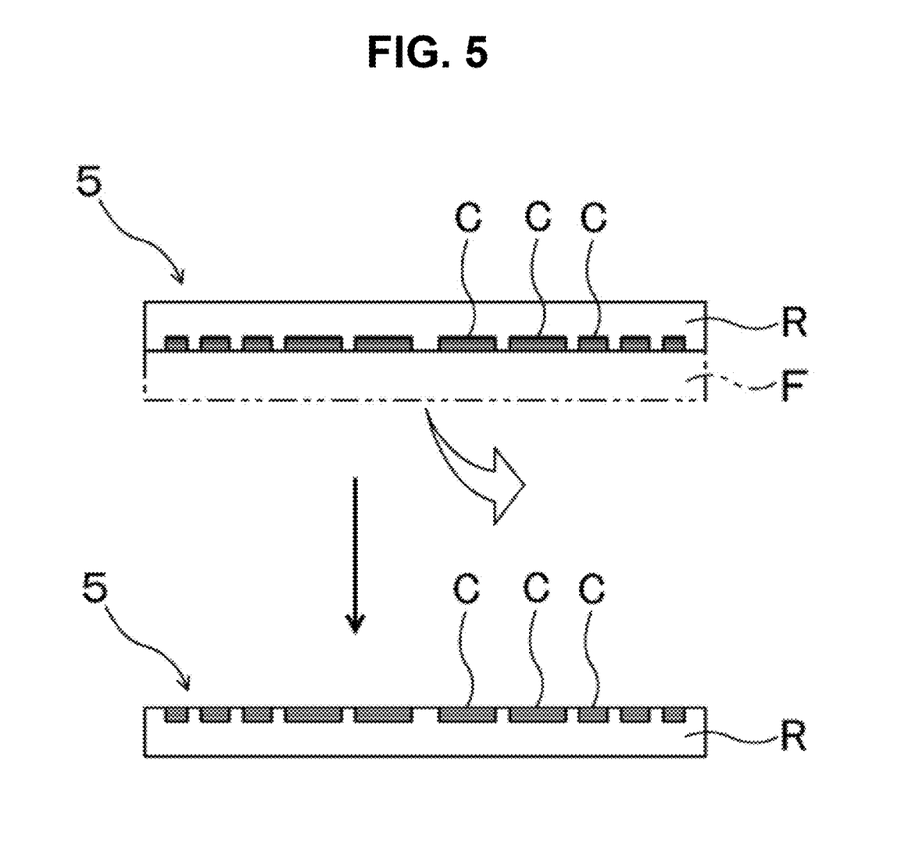
FIG. 5 is a diagram for describing the structure of an electronic circuit board according to a fifth embodiment of the present disclosure.

After the production of the board, the carrier F is removed from the board, which is in turn inverted as shown in a lower part of the FIG. 5. Thus, the electronic circuit board 5 is produced. An electronic component or the like is mounted on a surface of the electronic circuit board 5 to which the electrically conductive ink layer (electronic circuit C) is exposed. The other arrangement of the electronic circuit board 5 is the same as in the second embodiment. The fifth embodiment provides the same effect as the first and second embodiments. As in the second embodiment, the ink receiving layer R has a significantly greater thickness than that of the electronic circuit board 1, 3, 4 so as to function as a support member in the form of a substrate after the removal of the carrier F.

EXAMPLES

Next, inventive examples will be described in conjunction with comparative examples. It should be understood that the disclosure be not limited to the following inventive examples.

Example 1 and Reference Examples 1 to 3

Ink receiving layers were respectively formed from various resin compositions on PET films each serving as a base, and electrically conductive ink layers (electronic circuits) were formed from a nano-ink composition (nano-silver colloidal ink) on the respective ink receiving layers. The electrical resistance (electrical conduction property) of each of the electronic circuits was measured for checking for the suitability of the resin compositions for the ink receiving layer.

Ingredients herein used are as follows:
<Base>
PET film (highly transparent polyester film COSMOSHINE (registered trade name) A4100 available from Toyobo Co., Ltd.) having a thickness of 100 μm with a surface thereof corona-treated for easy adhesion
<Nano-Ink Composition>
Nano-silver colloidal ink (silver nano-ink DryCure Ag-J available from Colloidal Ink Co., Ltd.) containing silver particles having particle diameters of 1 to 100 nm (an average particle diameter of 15 nm), an organic π-conjugated ligand and a solvent mainly containing water, and having a solid proportion of 5 to 20 weight % and a viscosity of 1 to 2000 mPa·s The following polymers were used for the resin compositions for the ink receiving layers. Polymer B was used in Example 2 to be described later.
<Polymer A (Main Component)>
Polyvinyl acetal (water/isopropanol solution of partially benzalated polyvinyl alcohol) (butyral resin S-LEC (registered trade name) KX-5 available from Sekisui Chemical Co., Ltd. and having a solid resin proportion of 8±2 weight % and a viscosity of 3000±1500 mPa·s)
<Polymer B (Main Component)>
Polyvinyl acetal (water/isopropanol solution of partially benzalated polyvinyl alcohol) (butyral resin S-LEC (registered trade name) KX-1 available from Sekisui Chemical Co., Ltd. and having a solid resin proportion of 8±2 weight % and a viscosity of 10000±6000 mPa·s)
<Polymer X (Subcomponent)>
Polyester resin (aqueous dispersion) (PESRESIN A-640 available from Takamatu Oil & Fat Co., Ltd. and having a solid resin proportion of 25 weight % and a viscosity of not higher than 50 mPa·s
<Polymer Y (Subcomponent)>
Polyvinyl alcohol resin (aqueous solution) having a saponification degree of 88 mol % and a viscosity of 5 mPa·s
<Formation of Ink Receiving Layer>
The aforementioned base (PET film) was put on a flat place, and then the liquid resin compositions were each applied onto the base by means of a bar coater. Thereafter, the resulting resin composition layer was heated together with the base in an oven at 100° C. for 2 minutes to be thereby dried. Thus, ink receiving layers each having a thickness of 8 μm were respectively formed from Polymer A (Example 1), Polymer X (Reference Example 1) and Polymer Y (Reference Example 2).
<Production of Electronic Circuit Boards>
The aforementioned nano-ink composition (nano-silver colloidal ink) was applied in an elongated shape having a width of 5 mm and a length of not less than 100 mm on each of the resulting ink receiving layers by means of a bar coater, and heated together with the base in an oven at 40° C. for 20 minutes to be thereby dried. Thus, electronic circuit boards of Example 1, Reference Example 1 and Reference Example 2 were produced. An electronic circuit board of Reference Example 3 was produced by applying and drying the nano-silver colloidal ink directly on the base under the same conditions as described above without the application of the resin composition. That is, the electronic circuit board of Reference Example 3 had no ink receiving layer.
<Measurement of Electrical Resistance>
A tester (digital tester available from Custom Corporation) was used. Probes of the tester were brought into contact with the elongated ink layer (having a length of not less than 100 mm) so as to be longitudinally spaced 10 mm from each other. Then, the electrical resistance (Ω/cm) of each of the electronic circuit boards was measured. Since the electrical resistance was significantly varied, the measurement was carried out at different longitudinal positions a plurality of times. The maximum of the measured electrical resistances was employed as the electrical resistance of the electronic circuit board. The results are shown in Table 1.

TABLE 1

| | | Example 1 | Reference Example 1 | Reference Example 2 | Reference Example 3 |
|---|---|---|---|---|---|
| Ink receiving layer | | | | | |
| Polymer A | Polyvinyl acetal (parts by weight) | 100 | | | 0 |
| Polymer B | Polyvinyl acetal (parts by weight) | | | | 0 |
| Polymer X | Polyester (parts by weight) | | 100 | | 0 |
| Polymer Y | Polyvinyl alcohol (parts by weight) | | | 100 | 0 |
| Thickness (μm) | | 8 | 8 | 8 | — |
| Electrically conductive ink (electronic circuit) layer | | | | | |
| Thickness (μm) | | 3 | 3 | 3 | 3 |
| Base | | | | | |
| Film thickness (μm) | | 100 | 100 | 100 | 100 |
| Electrical resistance for 5-mm width (Ω/cm) | | ≤10 | * | * | * |

* Higher than measurement limit

As apparent from Table 1, the electronic circuit board of Example 1 including the ink receiving layer formed from the resin composition containing the polyvinyl acetal resin as the major component properly ensured the electrical conduction of the electrically conductive ink layer (electronic circuit). Further, it was confirmed that the electronic circuit board of Reference Example 3 in which the nano-ink composition was applied directly on the base formed with no ink receiving layer failed to ensure the electrical conduction of the electrically conductive ink layer (electronic circuit). Though not shown in Table 1, electronic circuit boards (for test) were produced by employing an acryl resin, a carboxyl-modified acryl resin, a polyacrylamide resin, a urethane resin and an ester urethane resin free from the cationic component for the resin composition for the formation of the ink receiving layer in addition to the electronic circuit boards produced by employing the polyester resin (Polymer X, Reference Example 1) and the polyvinyl alcohol resin (Polymer Y, Reference Example 2). The electrically conductive ink layers (electronic circuits) formed on the ink receiving layers of these electronic circuit boards failed to exhibit the electrical conduction.

Examples 2 to 6 and Comparative Examples 1 to 3

Next, examples in which resin compositions each containing the aforementioned polyvinyl acetal resin (main component) and another resin (subcomponent) were used for formation of ink receiving layers will be described.

The subcomponent resins not effective for ensuring the electrical conduction of the electrically conductive ink layer (electronic circuit) were blended with the polyvinyl acetal resin proved to be effective in Example 1, and the threshold proportions of the subcomponent resins that allow the ink receiving layers to provide the electrical conduction ensuring effect for the electrically conductive ink layer were determined. The blending of the subcomponent resins with the polyvinyl acetal resin is expected to improve the compatibility, the adhesion and the like of the resin composition with respect to the base to thereby increase the applicability of the inventive electronic circuit board to various types of bases.

Ingredients herein used were the same as in Example 1. However, Polymer B was used instead of Polymer A (Example 1) as the polyvinyl acetal resin (base polymer) for the mixed system. Polymer X or Polymer Y (subcomponent) was blended with Polymer B in proportions (parts by weight) shown below in Tables 2 and 3 with the total amount of the resins being 100 parts by weight. Polymer B and Polymer X or Polymer Y were dispersed in a constant solid resin proportion (8 weight %) in a solvent in each of the liquid resin compositions.

<Formation of Ink Receiving Layers>

As in Example 1, the base (PET film) was put on a flat place, and then the liquid resin compositions were each applied onto the base by means of a bar coater. Thereafter, the resulting resin composition layer was heated together with the base in an oven at 100° C. for 2 minutes to be thereby dried. Thus, an ink receiving layer (Polymer B) for Example 2, ink receiving layers (Polymer B+Polymer X) for Examples 3 and 4, ink receiving layers (Polymer B+Polymer Y) for Examples 5 and 6, ink receiving layers (Polymer B+Polymer X) for Comparative Examples 1 and 2 and an ink receiving layer (Polymer B+Polymer Y) for Comparative Example 3 were formed as each having a thickness of 8 μm.

<Production of Electronic Circuit Boards>

Electronic circuit boards of Examples 2 to 6 and Comparative Examples 1 to 3 (each including an electronic circuit having a thickness of 3 μm) were produced in substantially the same manner as in Example 1, except that the different ink receiving layers were used.

The electrical resistance of each of the electronic circuit boards was measured by the same electrical resistance measurement method as in Example 1. The measurement results are shown below in Tables 2 and 3.

TABLE 2

| | | Example 2 | Example 3 | Example 4 | Example 5 |
|---|---|---|---|---|---|
| Ink receiving layer | | | | | |
| Polymer A | Polyvinyl acetal (parts by weight) | | | | |
| Polymer B | Polyvinyl acetal (parts by weight) | 100 | 70 | 50 | 80 |
| Polymer X | Polyester (parts by weight) | | 30 | 50 | |
| Polymer Y | Polyvinyl alcohol (parts by weight) | | | | 20 |
| | Thickness (μm) | 8 | 8 | 8 | 8 |
| Electrically conductive ink (electronic circuit) layer | | | | | |
| | Thickness (μm) | 3 | 3 | 3 | 3 |
| Base | | | | | |
| | Film thickness (μm) | 100 | 100 | 100 | 100 |
| | Electrical resistance for 5-mm width (Ω/cm) | ≤10 | ≤10 | ≤30 | ≤30 |

TABLE 3

| | | Example 6 | Comparative Example 1 | Comparative Example 2 | Comparative Example 3 |
|---|---|---|---|---|---|
| Ink receiving layer | | | | | |
| Polymer A | Polyvinyl acetal (parts by weight) | | | | |
| Polymer B | Polyvinyl acetal (parts by weight) | 50 | 30 | 15 | 30 |
| Polymer X | Polyester (parts by weight) | | 70 | 85 | |
| Polymer Y | Polyvinyl alcohol (parts by weight) | 50 | | | 70 |
| | Thickness (μm) | 8 | 8 | 8 | 8 |
| Electrically conductive ink (electronic circuit) layer | | | | | |
| | Thickness (μm) | 3 | 3 | 3 | 3 |
| Base | | | | | |
| | Film thickness (μm) | 100 | 100 | 100 | 100 |
| | Electrical resistance for 5-mm width (Ω/cm) | <100K | 100K≤ | 2M≤ | 2M≤ |

As apparent from Tables 2 and 3, the electrical conduction of the electrically conductive ink layer (electronic circuit) was ensured with no problem in the electronic circuit boards of Examples 3 to 6 in which Polymer B (polyvinyl acetal resin) accounted for the majority (not less than 50 weight %) of the resin component of the resin composition for the ink receiving layer whether the subcomponent resin contained in the resin composition was Polymer X or Polymer Y. In contrast, the electronic circuit boards of Comparative Examples 1 to 3 in which the proportion of Polymer B was less than 50 weight % based on the weight of the resin component of the resin composition for the ink receiving layer were insufficient in the electrical conductivity of the electrically conductive ink layer and, therefore, were inferior in the electrical conduction property of the electrically conductive ink layer (electronic circuit), possibly failing to ensure that an electronic component mounted thereon functions properly.

Next, a large-scale electronic circuit board produced as having substantially the same construction as in Example 1 will be described.

First, a large-scale rectangular ink receiving layer having a size of 200 mm×300 mm was formed on a PET film base in the same manner by using the same ingredients as in Example 1. Then, an electrically conductive ink layer (electronic circuit) of a nano-ink composition formed in a predetermined circuit pattern was transferred onto the ink receiving layer by means of a flexographic printing machine, and dried. Thus, an electronic circuit board was produced.

The nano-ink composition herein used was of a flexographic printing grade.

<Nano-Ink Composition>

Nano-silver colloidal ink (silver nano-ink DryCure B available from Colloidal Ink Co., Ltd.) containing silver particles having particle diameters of 1 to 100 nm (an average particle diameter of 15 nm), an organic π-conjugated ligand and a solvent mainly containing water, and having a solid proportion of 20 weight % and a viscosity of 152 mPa·s Operating (transferring) conditions for the flexographic printing were as follows:

<Flexographic Printing Machine>

SMART LABO-III (registered trade name) available from Komura-Tech Co., Ltd.

<Flexographic Printing Plate>

Polyester rubber resin relief plate Type T-YP400V available from Komura-Tech Co., Ltd., and having a plate thickness of 2.84 mm, 600 lines/inch, a hardness (Shore-A hardness) of 40 to 70 degrees and an ink retention amount of 4 ml/m$^2$ (with a controllable range of 1 to 5 ml/m$^2$) on a printing ink retaining portion. The ink retaining portion on the surface of the printing plate was configured in a 1-mm width electronic circuit pattern.

<Anilox Roll>

200 lines/inch (100 to 600 lines/inch)

Cell capacity (cell volume) of 8 ml/m$^2$ (with a controllable range of 1.5 to 50 ml/m$^2$)

<Conditions for Flexographic Printing>

Printing speed (printing stage moving speed): 18 m/minute
Anilox roll speed (circumferential speed): 25 m/minute
Nip width between Anilox roll and printing plate: 8 mm (with a controllable range of 4 to 8 mm)
Nip width between printing plate and base: 10 mm (with a controllable range of 8 to 12 mm)
Printing chamber environment (atmosphere): At a temperature of 15° C. to 30° C. and a humidity of 40 to 70% RH The electrically conductive ink layer was printed (transferred) in the same position (in the same pattern) three times in order to impart the electronic circuit with a proper thickness (film thickness).

<Conditions for Drying after Printing>

Air drying (natural drying under an atmospheric pressure) at a temperature of 23° C. for 30 seconds to 60 minutes When hot air was applied for acceleration of the drying of the electrically conductive ink layer (nano-ink composition), the temperature of the hot air and the temperature of the base were maintained at not higher than 70° C.

<Electrical Resistance of Electronic Circuit>

Electrical resistance (Ω) between two points (spaced a distance of 10 mm from each other) of a 1-mm width electronic circuit (wiring) around the center of the wiring pattern of the electronic circuit was measured by means of a tester (digital tester available from Custom Co., Ltd.) As a result, the electrically conductive ink layer (electronic circuit) had a thickness of 2 μm and an electrical resistance of 15Ω.

<Operation Test of Electronic Circuit>

The electronic circuit boards each proved to have a proper electrical conduction property by the aforementioned electrical resistance test were used for operation test. Electronic components including an IC, an LED and the like were mounted in predetermined positions (on bumps and the like) of the electronic circuit (wiring) of each of the electronic circuit boards with the use of an electrically conductive paste (silver/copper electrically conductive paint PTP-1202G (available from Plascoat Corporation) which is of an organic solvent type to be dried and cured at an ordinary temperature, and contains silver-coated copper particles and a single-component polyester resin binder). Then, a power source was connected to the electronic circuit boards. As a result, it was visually confirmed that the LED was blinked in a predetermined sequence on each of the electronic circuit boards. Thus, the electronic circuit boards were proved to function properly.

While specific forms of the embodiments of the present disclosure have been shown in the aforementioned inventive examples, the inventive examples are merely illustrative of the disclosure but not limitative of the disclosure. It is contemplated that various modifications apparent to those skilled in the art could be made within the scope of the disclosure.

The electronic circuit board according to the present disclosure is highly reliable without electrical discontinuity of the electronic circuit thereof due to disconnection or the like of the electronic circuit, and maintains its performance for a longer period of time. In the electronic circuit board production method according to the present disclosure, the electronic circuit of the nano-ink composition can be efficiently and stably formed on the surface of the base, even if the base is a thermally-unstable flexible base such as of paper or a resin, leather, skin, artificial skin, a film of food fibers or cellulose nano-fibers, an animal-derived film such as produced by microorganisms or bacteria, or a film derived from a plant such as a tree or a vegetable, which is liable to be deteriorated in physical properties in a specific atmosphere.

REFERENCE SIGNS LIST

C: Electronic Circuit
R: Ink Receiving Layer

The invention claimed is:

1. An electronic circuit board production method comprising the steps of:
applying a liquid resin composition comprising a polyvinyl acetal resin as a main component on a base to form a layer of the liquid resin composition;
heat-drying the liquid resin composition to form an ink receiving layer; and
forming an electronic circuit in a predetermined circuit pattern from an electrically conductive ink by a printing method or a transferring method,
wherein the electrically conductive ink is a nano-ink composition comprising metal particles,
wherein the electronic circuit forming step includes steps of applying the nano-ink composition in the predetermined circuit pattern, and drying the nano-ink composition such that the temperature of the base is maintained at not higher than 70 ° C., and
wherein the base is formed of a material which is at least one selected from the group consisting of paper, a paper sheet, a resin film, leather, skin, artificial skin, a film of food fibers or cellulose nano-fibers, an animal-derived film, and a film derived from a plant.

2. The electronic circuit board production method according to claim 1, wherein the nano-ink composition further comprises metal nano-particles, an organic π-conjugated ligand and a solvent.

3. The electronic circuit board production method according to claim 1, wherein the polyvinyl acetal resin is a partially benzalated polyvinyl alcohol.

4. The electronic circuit board production method according to claim 1, wherein all steps are performed at an atmospheric pressure.

5. The electronic circuit board production method according to claim 1, wherein, in the step of forming an electronic circuit in a predetermined circuit pattern from the electrically conductive ink by a printing method or a transferring method, the printing method or the transferring method is performed by using a flexographic plate.

6. The electronic circuit board production method according to claim 1, wherein, in the step of forming an electronic circuit in a predetermined circuit pattern from the electrically conductive ink by a printing method or a transferring method, the electrically conductive ink is not subjected to a firing process.

* * * * *